United States Patent [19]

Nathanson et al.

[11] 4,106,046
[45] Aug. 8, 1978

[54] RADIANT ENERGY SENSOR

[75] Inventors: Harvey C. Nathanson, Pittsburgh; Michael M. Sopira, Penn Hills, both of Pa.

[73] Assignee: Westinghouse Electric Corp., Pittsburgh, Pa.

[21] Appl. No.: 762,544

[22] Filed: Jan. 26, 1977

[51] Int. Cl.² .......................................... H01L 27/14
[52] U.S. Cl. ........................................ 357/30; 357/24; 357/41; 357/55; 357/45; 357/60; 250/332
[58] Field of Search ...................... 357/30, 55, 24, 60, 357/41, 45; 250/332

[56] References Cited

U.S. PATENT DOCUMENTS

| 3,748,479 | 7/1973 | Lehovec | 250/208 |
| 3,794,883 | 2/1974 | Bylander | 317/234 R |
| 3,989,946 | 11/1976 | Chapman | 250/332 |

OTHER PUBLICATIONS

Fraser et al., Tech. Digest of IEEE Electron Device Meeting, Wash. D.C. (Dec. 9-11, 1974), pp. 442-445.

Primary Examiner—Martin H. Edlow
Attorney, Agent, or Firm—R. M. Trepp

[57] ABSTRACT

An improved radiant energy sensor incorporating a number of elongated detectors, circuitry, and narrow grooves on a crystalline substrate is described which receives radiant energy in the direction of the elongated detectors where the elongated detectors are electrically and optically isolated from adjacent detectors by narrow grooves in the substrate and where the detectors hold the incident radiant energy within the detector by the reflection of the radiant energy from the side surfaces of the same narrow grooves.

13 Claims, 12 Drawing Figures

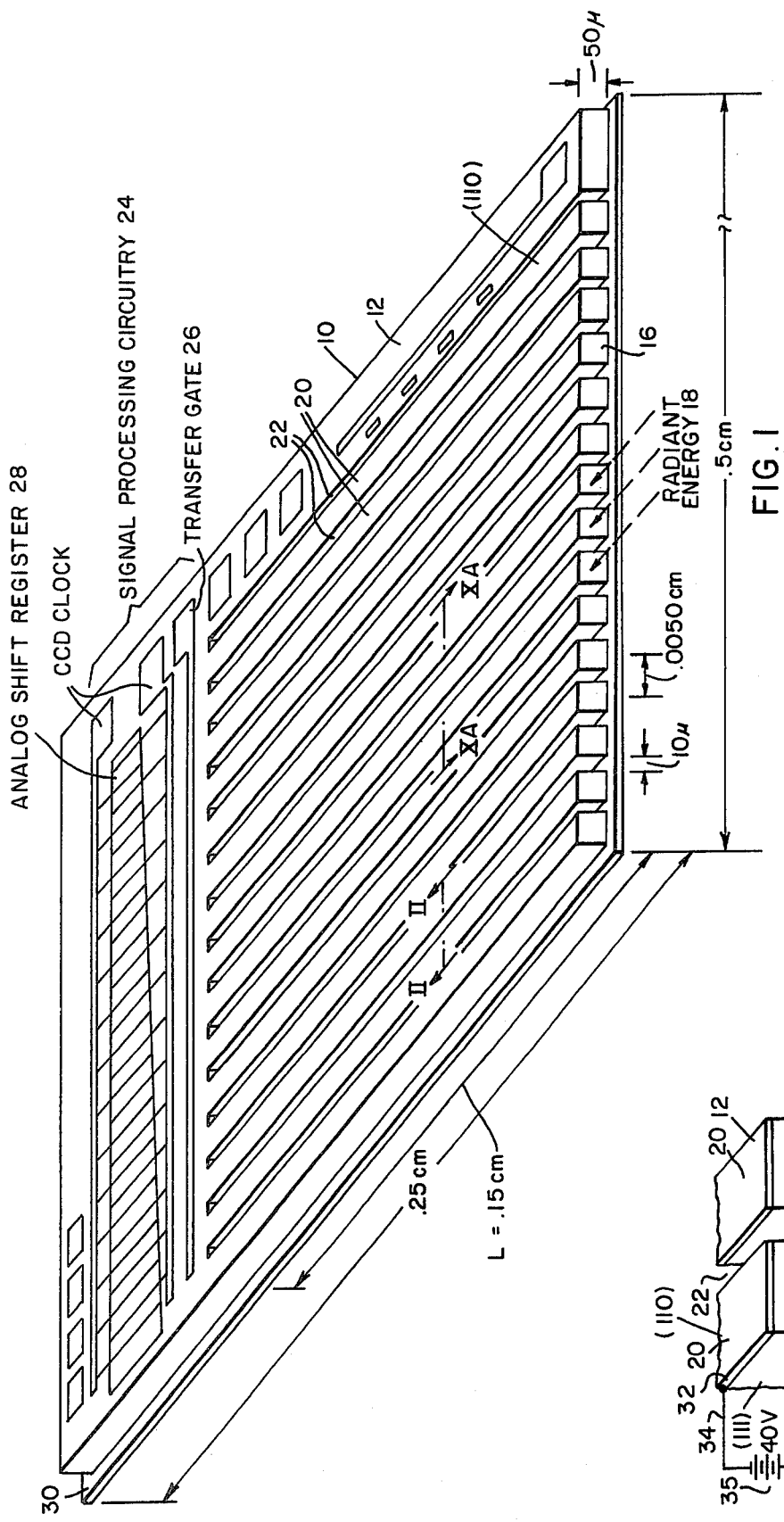
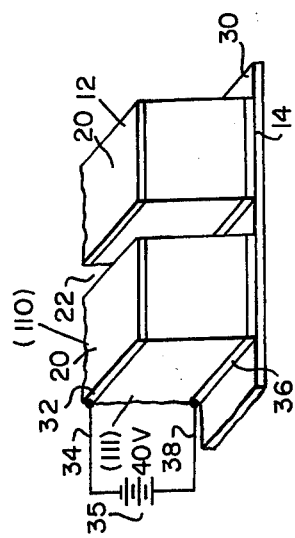
FIG.1
FIG.2

SCENE MOTION

RADIANT ENERGY SENSOR

BACKGROUND OF THE INVENTION

1. Field of the Invention

This invention relates to radiant energy sensors, and more particularly, to an improved radiant energy sensor employing a plurality of elongated detectors, circuitry, and narrow grooves on a crystalline substrate.

2. Description of the Prior Art

In the prior art sensors for radiation in the infrared region such as from 3 to 12 microns in wavelength utilized detectors such as lead tin telluride or mercury cadmium telluride, lead sulfide, lead selenide, or lead telluride which were combined with separate signal processing circuitry which incorporated such features as antiblooming, background subtraction and time delay integration to provide a desired output. The signal processing circuitry could be bipolar, metal oxide silicon (MOS) or charge coupled device (CCD) which are generally fabricated on silicon substrates. The detectors and the signal processing circuitry were assembled incorporating hybrid packaging systems utilizing a handmade interconnection scheme such as wire bonding or epoxied wires. Hybrid packaging systems have a lower sensor packing density, lower reliability and an increased cost as compared to a monolithic integrated circuit containing the entire sensor.

A monolithic structure incorporating both the detectors for infrared radiation and the signal processing circuitry utilizing charge coupled devices was described by J. C. Fraser et al in the Technical Digest of the International Electronic Devices Meeting sponsored by IEEE Group on Electron Devices held in Washington, D.C. (1974). However, poor isolation between extrinsic silicon sensor elements was reported caused by both optical and electrical cross talk between sensor elements resulting in degraded detector sharpness and modulation transfer function (MTF).

An example of a prior art structure which provided minimum optical cross talk and minimum electrical cross talk between sensor elements or detectors is described by F. J. Kaisler et al in U.S. Pat. No. 3,110,816, issued on Nov. 12, 1963 and assigned to the assignee herein. The patent to Kaisler shows a plurality of light pipes, each light pipe condensing the light entering the entrance pupil down to the smaller area of the exit pupil and a plurality of light sensitive detectors positioned to receive light on a one-to-one basis from the exit pupils of corresponding light pipes with each detector being physically and electrically isolated from each other.

It is therefore desirable to provide a completely monolithic infrared sensor including detectors and signal processing circuitry wherein the detectors have high quantum efficiency, minimum optical cross talk and minimum electrical cross talk. Furthermore, it is desirable for a monolithic infrared sensor to have a detector thickness of 1 millimeter or more to provide 60% quantum efficiency and minimum dark current noise. It is desirable to have a plurality of monolithic infrared sensor substrates, each with its detectors located on 50 micron centers or less to provide an array of several thousand detectors to form one forward looking infrared sensor.

SUMMARY OF THE INVENTION

In accordance with the present invention a method and means is provided for converting radiant energy into electrical signals by utilizing a crystalline substrate having a predetermined crystalline orientation, an upper and lower substrate surface and an end surface, the end surface being suitable for receiving radiant energy, wherein the substrate includes a plurality of elongated detectors for generating electronic charge in response to the passing of radiant energy through the end surface and the detector, and wherein one of the elongated detectors has portions thereof physically separated from adjacent detectors by grooves in the substrate, wherein the grooves extend from the upper surface towards the lower surface and have side walls bounded by selected crystalline planes of the substrate for electrically and optically isolating the detector from adjacent detectors. A plurality of substrates may be combined together to form a sensor array.

BRIEF DESCRIPTION OF THE DRAWINGS

FIG. 1 is a perspective view of one embodiment of the invention;

FIG. 2 is a cross-sectional view through the lines II—II of FIG. 1;

DESCRIPTION OF THE PREFERRED EMBODIMENTS

Figure 3:
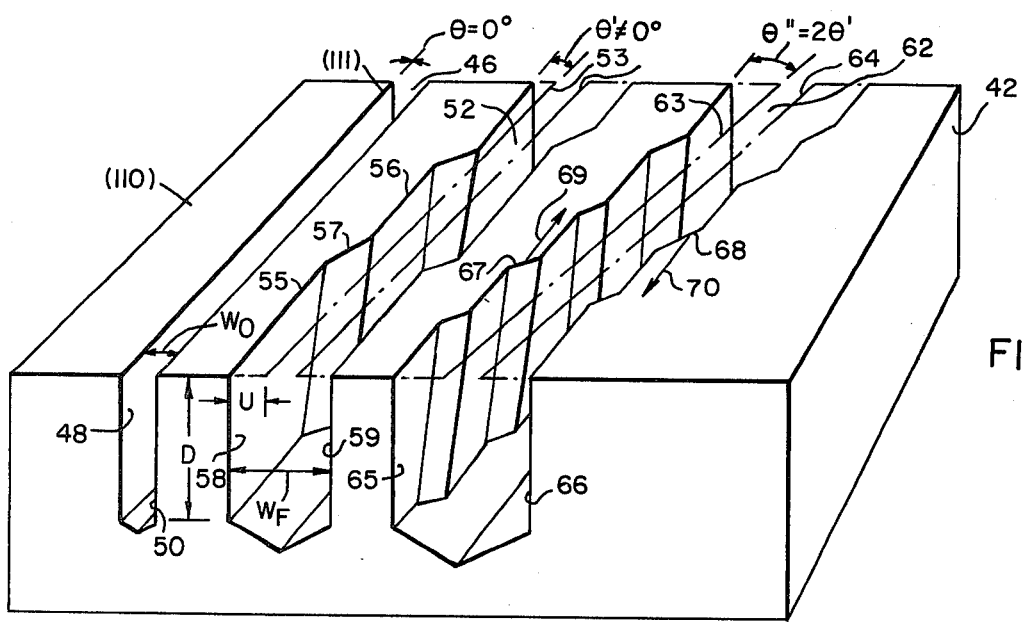
FIG. 3 is a perspective view of etched grooves in a silicon substrate with various orientations to the {111} crystalline plane.

Referring to FIG. 1, a perspective view of one embodiment of the invention is shown. Crystalline substrate 10 has a predetermined crystalline orientation with a selected crystalline plane located in or close to the upper substrate surface 12. The crystalline substrate 10 may, for example, be silicon with the (110) plane located in or close to the upper substrate surface 12. Crystalline substrate 10 may also be crystalline material such as indium antimony or germanium which also have selective etch properties. Beneath the upper substrate surface 12 on the underside of substrate 10 is the lower substrate surface 14. Terminating the upper and lower substrate surface 12 and 14 at one end of substrate 10 is end surface 16 or surfaces 16 which function to pass radiant energy 18 into substrate 10. Radiant energy 18 may for example originate from objects and organic matter as a function of their particular temperature. The radiant energy 18 entering substrate 10 may represent a field-of-view or image of objects and organic matter such as a view from an airplane towards the earth. Within substrate 10 are a plurality of elongated detectors 20 for receiving radiant energy 18 after it passes through end surface 16. Elongated detectors 20 generate electronic charge in response to the radiant energy 18. The elongated detectors 20 are separated from one another by grooves 22 in the crystalline substrate 10 which function to optically and electrically isolate adjacent detectors. The grooves or slots may extend from the upper substrate surface 12 to some point below the upper substrate surface or the grooves may extend from the upper substrate surface 12 all the way through to the lower substrate surface 14. Of course, if the grooves do not completely physically isolate adjacent detectors, then the optical and electrical isolation will be reduced by some degree. The side edges or side walls of grooves 22 are bounded by selected crystalline planes of the crystalline substrate 10. If the crystalline substrate 10 is silicon, then the side edges or side walls of grooves 22 would be bounded by selected crystalline planes of the substrate 10.

In addition to the elongated detectors 20 and the grooves 22 within substrate 10 there may also be signal processing circuitry 24 including circuitry for transferring charge from the elongated detectors 20 to itself. A transfer gate 26 provides the means for transferring the charge from the elongated detectors 20 at the appropriate time to the signal processing circuitry 24 which may include an analog shift register 28. The analog shift register may, for example, be used to provide time delay and integration (TDI). In time delay and integration a particular point in a scene is moved sequentially from detector to detector. The output of the detector for a particular point in a scene or image is moved by means of the analog shift register to the output of the next detector which is directed towards the same point on the scene or image and the output of this detector is added to the output of the prior detector to provide a summation of the two detectors. A particular point in a scene or image may be passed from detector to detector such as 16 or 32 detectors with the detector outputs added to provide an enhanced signal-to-noise ratio as compared to the signal-to-noise ratio of the output of one detector. The analog shift register may for example utilize charged coupled devices (CCD). The transfer gate 26 may for example be a metal oxide silicon (MOS) field effect transistor (FET). By placing additional circuitry on the crystalline substrate 10 other signal processing functions may be performed such as anti-blooming and background subtraction. The principal advantage of having signal processing circuitry 24 located on substrate 10 together with the elongated detectors 20 is that the interconnections between the elongated detectors 20 and the signal processing circuitry 24 may be made with standard integrated circuit interconnections such as by aluminum metallization or conductive diffusions. In the prior art, handmade interconnections such as by wire bonding or epoxied wires were required to interconnect the detector to the signal processing circuitry. As shown in FIG. 1 the elongated detectors on substrate 10 along with signal processing circuitry 24 including the transfer gate 26 provide a monolithic sensor which can contain complete information processing and utilizes integrated circuit technology to provide higher packing density, increase reliability, and more economical devices.

Substrate 10 may be mounted on a cold plate 30 for providing thermal cooling of the elongated detectors 20. Cold plate 30 may for example be Kovar material which has a thermal expansion coefficient that matches the thermal expansion coefficient of silicon. Liquid nitrogen or helium may be used to lower the temperature of the cold plate 30.

Referring to FIG. 2 a cross-sectional view through the lines II—II of FIG. 1 is shown. FIG. 2 shows a cross-section of elongated detectors 20, grooves 22, the upper substrate surface 12 and the lower substrate surface 14. Cold plate 30 is shown adjacent the lower substrate surface 14. With substrate 10 being silicon, elongated detectors 20 may for example be extrinsic silicon doped with gallium to a concentration of $2 \times 10^{16}$ atoms per cubic centimeter which provides an attractive dopant for an 8 to 14 micron radiant energy detector. Elongated detectors 20 have a P diffusion into the upper substrate surface 12 and a P+ diffusion into the lower substrate surface 14 which function as conductive electrodes which may be placed at a particular potential to provide an electric field between the upper and lower substrate surface 12 and 14, respectively. P diffusion 32 may be coupled over lead 34 to a negative potential such as the negative terminal of battery 35 or of a DC power supply. P+ diffusion 36 is coupled over lead 38 to a positive potential such as the positive terminal of battery 35 or a DC power supply. A typical voltage across the detector is 10 volts. The voltage may alternatively be coupled across detector 20 capacitively. The distance between the P diffusion 32 and the P+ diffusion 36 may for example be 50 microns.

For a gallium doped detector, the average photo ionization cross-section is on the order of $\sigma° \sim 10^{-16}$ cm$^2$. A high quantum efficiency detector such as one with 60% quantum efficiency has a length doping product of $N_{GA} \times L$ which is proportional to $10^{16}$ cm$^{-2}$ where $N_{GA}$ is the gallium doping per centimeter cubed and L is the pixel length or the length L of the elongated detectors 20. Doping levels of gallium in silicon in the range that would permit mimimum dark current noise such as $2 \times 10^{-16}$ atoms per cubic centimeter require L of the detector to be very long such a 1 millimeter or more to approach the 60% quantum efficiency level.

The grooves 22 or channels are fabricated in crystalline substrate 10 by utilizing the selective etch properties of the material such as silicon. The grooves 22 are fabricated in a silicon substrate by utilizing anisotropic etches on (110) surface oriented silicon which has special etched properties. By utilizing an anisotropic etch narrow and deep grooves 22 may be formed in the silicon substrate 10. When the grooves 22 or channels separating the elongated detectors 20 are aligned with the {111} planes which intersect with the (110) surface at right angles, grooves having a depth-to-width ratio on the order of 400 to 1 can be achieved for groove alignment of less than ¼ degree with respect to the {111}.

A perspective view of an etched groove in silicon with an alignment with the {111} plane of 0°, $\theta'$ and $2\theta'$ is shown in FIG. 3. A silicon substrate 42 is shown having an upper surface 44 which is in the (110) plane. A groove 46 is shown etched into substrate 42 aligned with the {111} plane having a width $W_O$ and a depth D. Groove 46 has side walls 48 and 50 which are smooth and follow along the {111} plane. A second groove 52 is shown in FIG. 3 etched into silicon substrate 42 which is misaligned with the {111} plane which intersects with the (110) plane at the surface of angle $\theta'$ having a width $W_F$ and a depth D. The initial etching width, $W_O$ at the start of etching is shown by mask lines 53 and 54. In etching groove 52 the etching in the width direction or undercutting stops at the {111} plane such as shown by planes 55 and 56. A crystal ledge however is formed between planes 55 and 56 and this ledge etches vigorously. Along side walls or edges 58 and 59 there are numerous crystal ledges formed due to the fact that the etching mask is misaligned with the {111} plane and because the etching stops at the {111} plane causing numerous crystal ledges to form which etch vigorously. The etching of the crystal ledges causes the groove or channel to widen by an increased amount which is denoted by the letter U to denote the undercutting of groove 52 on one side. A third groove 62 is shown having a misalignment angle of $2\theta'$ etched in silicon substrate 42. The original mask lines are shown by lines 63 and 64, side walls or edges 65 and 66 are shown having numerous crystal ledges such as 67 and 68 which etch vigorously which has the effect of widening groove 62. Arrows 69 and 70 show the direction of the etching of the crystal ledges 67 and 68 respectively. Due to the misorientation of groove 62 with respect to the {111} plane of $2\theta'$ more crystalline ledges are formed which tend to make groove 62 wider for a particular depth than for example groove 52 where less crystalline ledges are formed due to a lesser misalignment angle of $\theta'$.

Figure 4:
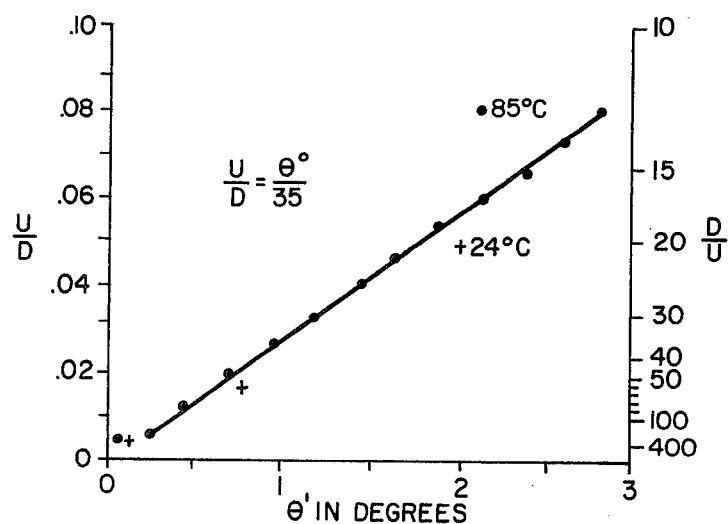
FIG. 4 is a curve showing the undercut to depth ratio (U/O) for grooves with various orientations to the {111} crystalline plane.

The curve in FIG. 4 shows the undercut to depth ratio for grooves in silicon with various orientations or misalignments with the {111} plane. In FIG. 4 for a $\frac{1}{4}$ degree misalignment angle $\theta'$ a depth to undercut ratio of 400 may be obtained. In FIG. 4 the abscissa represents degrees or misalignment angle and the left-hand ordinate represents the ratio undercut to depth, and the right-hand ordinate represents the ratio, depth to undercut. A suitable etchant for silicon to provide an isotropic etch may be 44% $KOH:H_2O$ at a temperature of 85° C and below. For a more detailed description of a process for etching very narrow grooves in silicon, reference is made to Kendall D. L., "On etching very narrow grooves in silicon," applied Physics Letters, Vol. 26, No. 4, Feb. 1975, pgs. 195 through 198 which is incorporated herein by reference.

Figure 5:
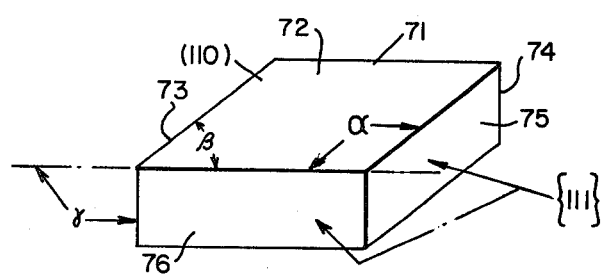
FIG. 5 is a perspective view of (110) surface silicon with crystallographic edges in the {111} plane.

Referring now to FIG. 5 an enlarged silicon crystal is shown having an upper surface 72 in a (110) face and having four side walls 73, 74, 75 and 76 which are in the {111} plane. The upper surface 72 intersected by side walls or edges 73, 74, 75 and 76 form a rhombic having an acute angle $\beta$ of 70.53° and an obtuse angle $\alpha$ of 109.47°. The angle between the side walls and the upper surface 72 is shown by $\gamma$ which is 90°. The side walls 73, 74, 75 and 76 are in the {111} plane. A silicon substrate would be formed by a number of enlarged crystals 71 placed side-by-side in a row and a number of rows placed side-by-side the first row to form a single crystal substrate having a rhombic surface. For a more detailed description of the crystal structure of silicon, reference is made to a book by L. B. Valdes entitled "The Physical Theory of Transistors," McGraw-Hill Book Company, New York, 1961, Chapter 2, pp 17-29 which is incorporated herein by reference.

Figure 6:
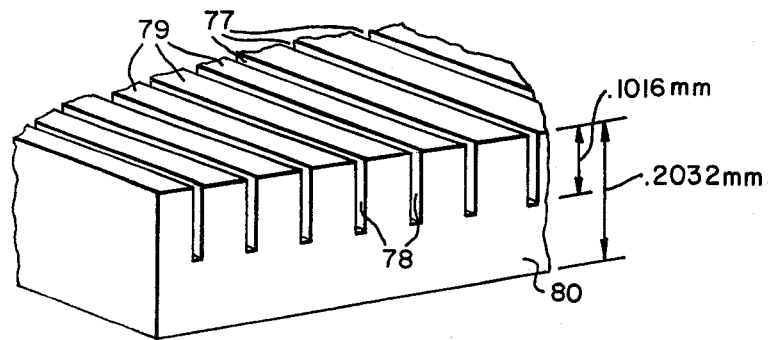
FIG. 6 shows detector and groove ends along a cleaved section of silicon.

One method of forming the end surfaces 16 of the elongated detectors 20 shown in FIGS. 1 and 2 is by cleaving the elongated detectors along a selected plane. FIG. 6 shows fingers or elongated detectors terminated by cleaving a section of the silicon along the {111} plane. The view in FIG. 6 is enlarged about 200 times which shows the narrow grooves 77 and the smoothness of the side walls or edges represented by side wall 78 of elongated detectors 79. As shown in FIG. 6 the depth of the grooves 77 are approximately 0.1016 millimeters (10.16 microns) and the substrate 80 is approximately 0.2032 millimeters thick (203.2 microns). As shown in FIG. 6 the surface finish of the side walls is very smooth and much much less than 3 microns. The smooth side walls provide a means for reflecting infrared radiation within the elongated detectors 20 or 79 to provide a light pipe in addition to (or incorporated into) the detectors 20 or 79. If the side walls of the detector are rough, light is lost by refraction through the random side walls. If the angle of light incident upon the side walls is less than the Brewster angle measured with respect to the side wall then all the light will be reflected off the side wall at the same angle as the incident angle resulting in all of the light being redirected or contained within the elongated detector.

Figure 7:
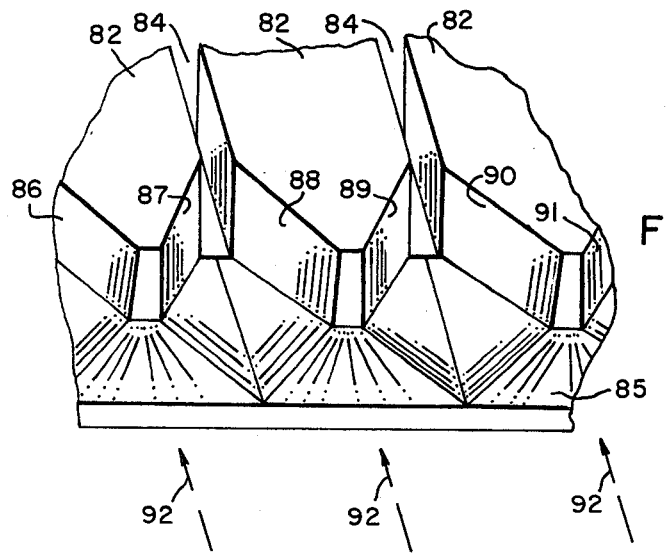
FIG. 7 shows detector and groove ends along an etched section of silicon.

An alternate method of creating end faces 16 of the elongated detectors 20 shown in FIG. 1 is by etching the substrate 10 at the place on the long detectors 20 where the end faces 16 are desired. FIG. 7 shows a perspective view of elongated detectors or fingers 82 separated by grooves or slots 84. The end faces of elongated detectors 82 were formed by etching away the silicon substrate 85. The end faces of the elongated detectors 82 are not left flat after the etching process which seriously impairs the optical coupling of the radiant energy 92. The etched ends or faces of elongated detectors 82 appear rounded having a triangular point with end faces 86 and 87, end faces 88 and 89, and end faces 90 and 91. The rounded or triangular pointed ends of elongated detectors 82 is due to the exposure of several oriented crystal faces at the desired end of the elongated detectors 82 which etch at various rates faster than the {111} plane, thus rounding off the end structure or face of elongated detectors 82.

Figure 8:
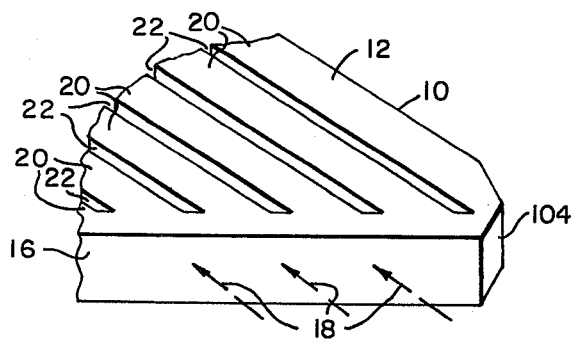
FIG. 8 shows an alternate embodiment of the invention.

FIG. 8 shows an alternate embodiment of the invention where like references are used for the structure corresponding to the apparatus of FIGS. 1 and 2. In the alternate embodiment grooves 22 terminate interior to the end of substrate 10 composed of silicon. In other words, the grooves have closed ends within the substrate 10 forming a grill-like appearance. The grooves 22 terminate interior to the ends of the substrate 10 and are oriented or aligned in the {111} plane orthogonal to the (110) plane which provide electrical and optical isolation depending upon the extent of the grooves between adjacent elongated detectors 20. An alternate description of the structure would be that the elongated detectors 20 have a thin web of substrate material or silicon on the detector or finger ends to prevent rounding of the detector or finger corners. The thin web of silicon may also be described as a thin silicon membrane along the elongated detector ends. The thin web of silicon is thin enough to permit radiant energy 18 to pass into the elongated detectors 20 with only a small percentage loss of radiant energy 18. End face 16 is shown having a very smooth surface which is vertical or transverse with respect to the upper surface 12 and has a surface finish of much much less than 3 microns. End face 104 is a rounded corner on the substrate 10 caused by exposure of several oriented crystal faces which etch faster than the {111} plane, thus rounding off the corner. The rounded off corner 104 could be shifted out of the path way of radiant energy 18 by either providing more silicon material between the last elongated detector and the side of the substrate 10 or by shifting the elongated detectors 20 away from the side of the substrate 10. A smooth continuous end face 16 as shown in FIG. 8 permits more radiant energy 18 to be coupled into elongated detectors 20 than if each elongated detector had its own end face with rounded corners. The elongated detector may extend to end face 16 by extending the P and P+ diffusions on the upper and lower surface or the elongated detector may be shortened by terminating the P+ and P diffusions on the upper and lower surface to the desired regions such as interior to the termination of the grooves 22.

Figure 9:
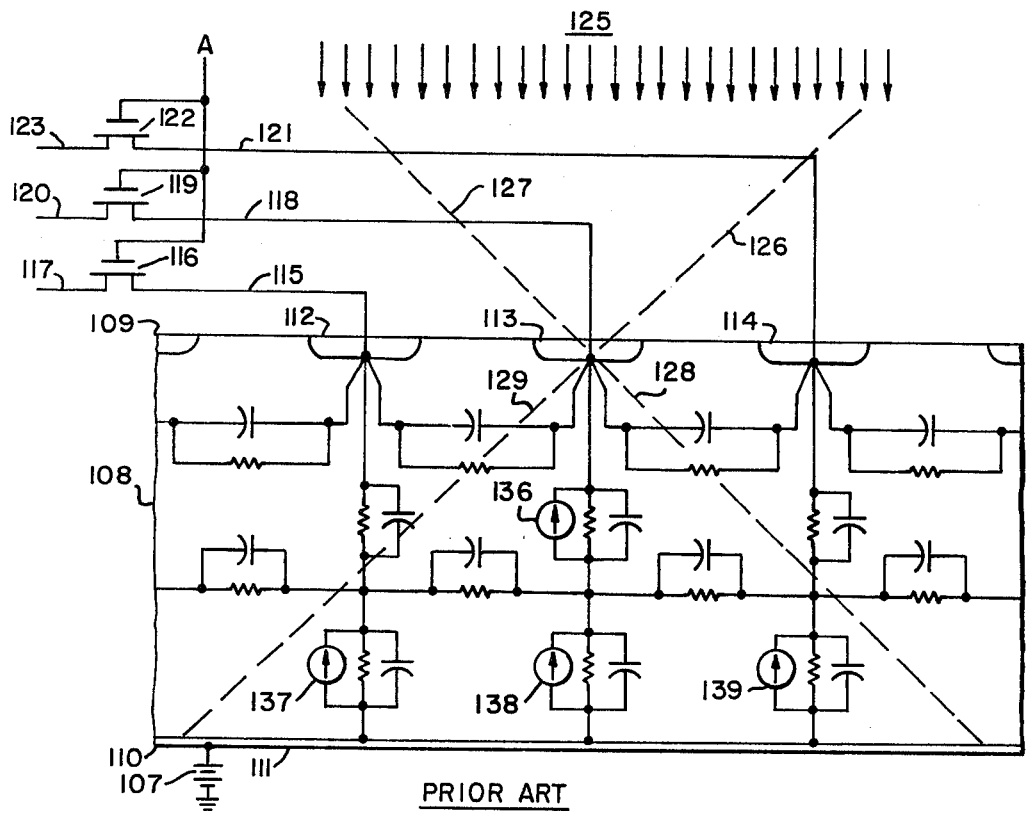
FIG. 9 shows a model of optical and electrical cross talk in a prior art device.

Referring now to FIG. 9 a schematic model is shown of a prior art homogeneous detector with respect to optical and electrical cross talk. The structure of FIG. 9 may also be described as a solid detector having a predetermined thickness. Substrate 108 composed of silicon has an upper surface 109 and a lower surface 110. The distance between the upper surface 109 and the lower surface 110 may be for example 500 microns. The lower surface 110 has a metallization 111 which functions to provide a ground plane or an electrode for detectors 112, 113 and 114. Metallization 111 is coupled through battery 107 to ground. Detectors 112, 113 and 114 are P diffusions into the upper surface 109 and are rectangular in shape with the full width of the detector being shown in FIG. 9. Detector 112 is coupled over line 115 through field effect transistor 116 to line 117 which serves as an output. Detector 113 is coupled over line 118 through field effect transistor 119 to line 120. Detector 114 is coupled over line 121 through field effect transistor 122 to line 123. Lines 117, 120 and 123 serve as the output of detectors 112, 113 and 114 respectively. Lines 117, 120, and 123 are fed to signal processing circuitry which is not shown. Upper substrate surface 109 has additional P+ diffusions or detectors located on its surface in a predetermined pattern such as a two-dimensional array having X rows and Y columns. The control of field effect transistors 116, 119 and 122 may for example be coupled to a control signal, A, which will turn the transistors to the conducting state at the appropriate times and to a nonconducting state during other times or the control may be coupled to ground. The field effect transistors would then be turned on depending upon the potential on lines 115, 118, and 121 or by the potential on lines 117, 120, and 123. Above the upper surface 109 of substrate 108 is a source of radiant energy 125 which is focused for example onto the upper surface 109. As shown in FIG. 9 a portion of radiant energy 125 is concentrated on the upper surface 109 at detector 113 and passes through the upper surface 109 and detector 113 into the body of silicon substrate 108 in a direction towards the lower surface 110. Lines 126 and 127 represent the outer limits of a cone of light which is concentrated on detector 113. Lines 128 and 129 show the outer limits of a cone of radiant energy which passes into substrate 108 towards the lower surface 110. The electrical characteristics of silicon substrate 108 between the upper surface 109 and the lower surface 110 may be represented by a grid of resistors and capacitors coupled together in parallel. As can be seen in FIG. 9 the electrical isolation between detectors 112 and 113 is limited by the characteristic of the substrate material 108 which is represented by a resistor and capacitor coupled in parallel directly between detectors 112 and 113 and additional resistors and capacitors coupled in a grid further below the upper substrate surface 109. The resistive coupling between adjacent detectors such as 112 and 113 is less than the resistive coupling between detector 112 and the metallization 111. The capacitive coupling between adjacent detectors such as 112 and 113 is greater than the capacitive coupling between detector 112 and metallization 111 or between detector 113 and metallization 111. Radiant energy 125 that passes into substrate 108 in the region between lines 128 and 129 generated charge within substrate 108 which is represented by current sources 136, 137, 138 and 139. The current sources 136 through 139 represent charge which is generated within substrate 108 which moves towards detector 113. The resistive and capacitive coupling however between detector 113 and its adjacent detectors 112 and 114 result in some of the charge from current sources 136 through 139 migrating or arriving at detectors 112 and 114 which results in a degraded output of detector 113 and with detector 112 and 114 having an output attributable to part of the signal that would have been on detector 113. In other words radiant energy which passes through detector 113 results in electrical signals appearing on detectors 112 and 114 in addition to the signal on detector 113. The path of light which passes underneath detector 112 and detector 114 represented by current sources 137 and 139 represent optical cross talk between detectors 113 and detectors 112 and 114. The radiant energy impinging on detector 113 is not contained within the region between detector 113 and metallization 111 but is allowed to continue to spread and pass into the region between detectors 112 and 114 which is the column of substrate material which extends down from upper surface 109 to metallization 111. The spreading of radiant energy 125 in substrate 108 which had passed through detector electrode 113 is a result of a low F/# system which focus radiant energy onto the upper surface 109 of substrate 108. The radiant energy 125 passes through detector 113 and continues to diverge and substrate 108 resulting in the generation of photocurrents outside the detector region 113 which is defined as the volume between P diffusion 113 and metallization 111 as projected by two parallel lines orthogonal to the surface 109 which degrades the contrast or sharpness of detectors 112, 113 and 114 resulting in a poor modulation transfer function (MTF). For a more detailed description of the modulation transfer function (MTF) of a series of detectors, reference is made to a book by L. M. Biberman and S. Nudelman entitled "Photelectronic Imaging Devices," Volume I, Plenum Press, New York, 1971, Chapter 13, pp 291–306 which is incorporated herein by reference.

Figure 10A:
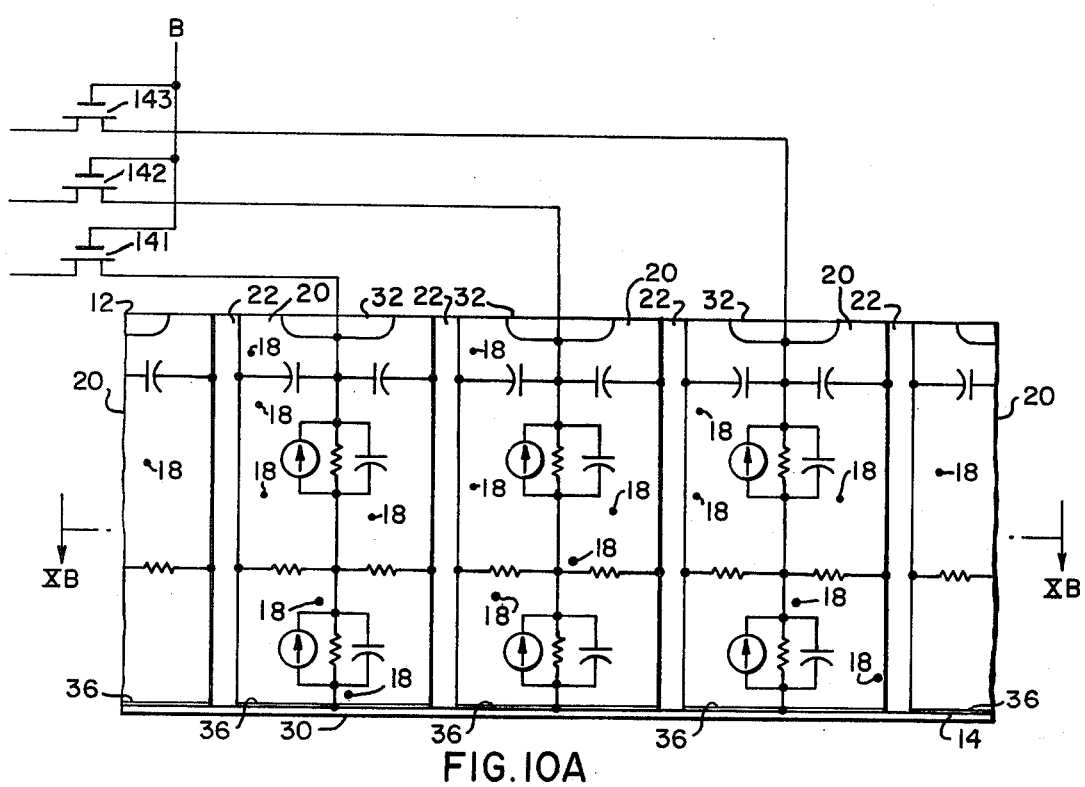
FIG. 10A shows a cross-sectional view through the lines XA—XA of FIG. 1 with optical and electrical cross talk characteristics schematically shown.
Figure 10B:
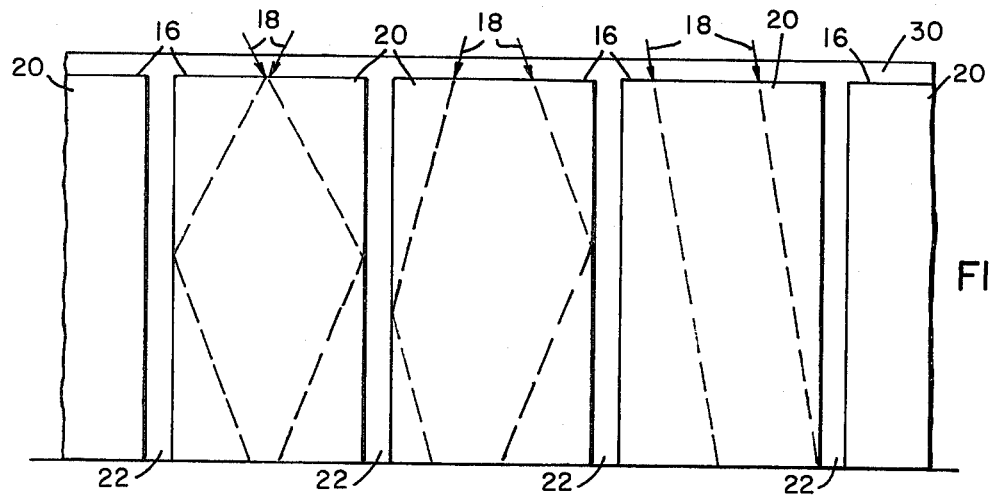
FIG. 10B shows a cross-sectional view through the lines XB—XB of FIG. 10A showing radiant energy reflecting off side walls and contained within the detectors.

FIG. 10A shows optical and electrical cross talk schematically for the embodiment of FIG. 1. Resistive and capacitive coupling in elongated detectors 20 are represented by a number of resistor and capacitive symbols within each elongated detector 20. Note there appears to be no resistive coupling between elongated detectors 20 and the capacitive coupling if any is across the air gap or groove 22 between the detectors which is negligible. Two current generators are shown in each elongated detector to show the generation of charge due to the passage and absorption of radiant energy 18 through the elongated detectors 20. The output of elongated detectors 20 are coupled out through field effect transistors 141, 142 and 143 which are controlled by signal B. Grooves 22 function to electrically isolate each elongated detector 20 from adjacent elongated detectors 20. In FIG. 10B a cross-section through the lines XB—XB of FIG. 10A is shown wherein radiant energy 18 is shown passing through end face 16 into the elongated detectors 20 which are separated by grooves 22. The radiant energy upon passing into the elongated detectors 20 are shown along their respective paths which are shown by dotted lines. If the angle of the incident radiant energy 18 with respect to the groove 22 or side wall is less than the Brewster angle the radiant energy will be reflected off the side wall of the groove 22 back into the elongated detector 20 causing the particular radiant energy 18 to be contained within the elongated detector 20. The radiant energy 18 is absorbed by elongated detector 20 by the generation of charge within the elongated detector 20. FIG. 10B shows that the effect of grooves 22 is to provide optical isolation between adjacent elongated detectors 20. Optical cross talk between elongated detectors as shown in FIG. 10B can only arise if radiant energy passes through a side wall of groove 22 through the air and into a side wall of an adjacent detector. The surface finish of the side walls of elongated detectors 20 forming the channel, groove or slot 22 must be smooth enough to prevent substantial amounts of radiant energy 18 measured with respect to the general direction of the side wall of elongated detector 20 from being refracted or bent outside its respective detector 20 and into an adjacent detector 20 which would cause optical cross-coupling.

Figure 11:
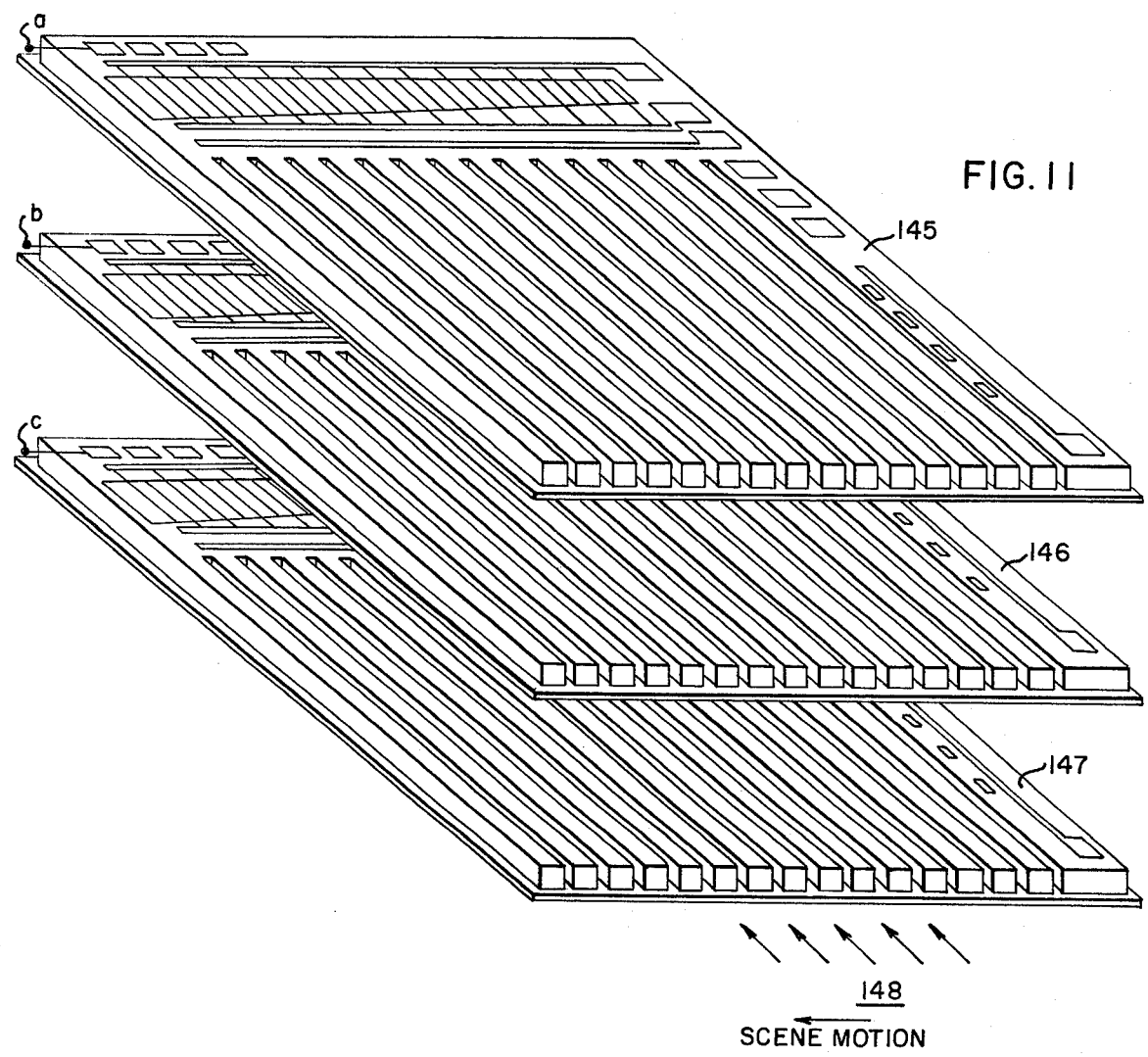
FIG. 11 shows a plurality of embodiments of FIG. 1 stacked one upon another to form a two-dimensional sensor array.

Referring now to FIG. 11 a plurality of monolithic line detectors 145, 146, and 147 are stacked to form an array of detectors where each line array may be the embodiment as shown in FIG. 1. By placing a plurality of line arrays one upon another a two-dimensional array of detectors are formed for receiving radiant energy 148. The output of each line array is shown in FIG. 11 as A, B and C which may be combined to provide outputs indicative of a scene or image. In FIG. 11, an arrow shows the direction of scene motion or conversely the assembly or array of detectors may move in the other direction in which case each detector of one line array would follow a particular point on the scene with the output being summed with the output of the next detector when the next detector is pointed at the same point on the scene to provide an enhance signal-to-noise ratio output signal. The time delay integration would be performed by the signal processing circuitry on the substrate. An image or scene would be produced by scanning. Alternately, each detector may have its own signal processing circuitry and the embodiment as shown in FIG. 11 would produce an image or scene in two-dimensional form without scanning the image or field of view.

The invention provides an apparatus for converting radiant energy into electrical signals by utilizing a crystalline substrate having a predetermined crystalline orientation and selective etch properties and having an upper and lower substrate surface and an end surface the end surface being suitable for receiving radiant energy, the substrate includes a plurality of elongated detectors for generating electronic charge in response to the passing of radiant energy through the end surface and detector, and one of the elongated detectors having portions thereof physically separated from adjacent detectors by grooves in the crystalline substrate, the grooves extending from the upper surface towards the lower surface and having side walls bounded by selected crystalline planes of the substrate for electrically and optically isolating the detector from adjacent detectors. A plurality of substrates may be combined together to form a sensor array.

We claim:

1. A sensor for converting radiant energy into electrical signals comprising:
   a crystalline substrate having a predetermined crystalline orientation, an upper and lower substrate surface and an end surface, said end surface suitable for receiving radiant energy;
   said substrate including a plurality of elongated detectors for generating electronic charge in response to the passing of radiant energy through said end surface and said detector; and
   one of said elongated detectors including conductive electrodes on said upper and lower substrate surface for placing a voltage potential between said upper and lower surface and having portions thereof physically separated from adjacent detectors by grooves in said substrate, said grooves extending from the upper surface towards the lower surface and having side walls bounded by selected crystalline planes of said substrate for electrically and optically isolating said detector and adjacent detectors.

2. The sensor of claim 1 wherein said grooves terminate interior of said end surface of said silicon substrate.

3. The sensor of claim 1 wherein said grooves extend from said upper surface to said lower surface.

4. The sensor of claim 1 wherein said upper surface is a selected crystalline plane.

5. The sensor of claim 1 wherein said end surface is formed by cleaving to provide a smooth surface.

6. The sensor of claim 2 wherein said end surface is formed by etching to provide an optically smooth surface.

7. The sensor of claim 1 wherein said side walls are smooth for reflecting radiant energy within said elongated detectors to contain said radiant energy.

8. The sensor of claim 1 including signal processing circuitry on said substrate for processing the outputs of said elongated detectors.

9. The sensor of claim 8 wherein said signal processing circuitry includes means for performing time delay integration.

10. The sensor of claim 9 wherein said means for performing time delay integration includes an analog shift register.

11. A sensor for converting radiant energy into electrical signals comprising:
    a silicon substrate having a predetermined crystalline orientation, an upper and lower substrate surface and an end surface suitable for receiving radiant energy;
    said silicon substrate including a plurality of elongated detectors for generating electronic charge in response to the passing of radiant energy through said end surface and said detector;
    said crystalline orientation of the (110) and {111} crystalline planes being aligned with at least one of said elongated detectors; and
    one of said elongated detectors including conductive electrodes on said upper and lower substrate surface for placing a voltage potential between said upper and lower surface and having portions thereof physically separated from adjacent detectors by grooves in said silicon substrate, said grooves extending from the upper surface towards the lower surface and having side walls bounded by the {111} crystalline plane of said silicon substrate for electrically and optically isolating said detector from adjacent detectors.

12. The sensor of claim 1 wherein said upper surface is in the (110) plane.

13. A sensor for converting radiant energy emanating from an image into electrical signals comprising:

a plurality of silicon substrates spaced and positioned one above another;

each silicon substrate having a predetermined crystalline orientation indicated by a (110) and {111} plane, an upper and lower substrate surface and an end surface suitable for receiving radiant energy;

said silicon substrate including a plurality of elongated detectors for generating electronic charge in response to the passing of radiant energy through said end surface and said detector;

said crystalline orientation of the (110) and {111} crystalline planes being aligned with at least one of said elongated detectors; and one of said elongated detectors including conductive electrodes on said upper and lower substrate surface for placing a voltage potential between said upper and lower surface and having portions thereof physically separated from adjacent detectors by grooves in said silicon substrate, said grooves extending from the upper surface towards the lower surface and having side walls bounded by the {111} crystalline plane of said silicon substrate for electrically and optically isolating said detector from adjacent detectors; and signal processing circuitry on said substrate for processing the outputs of said elongated detectors to provide a signal indicative of a portion of said image.

* * * * *